(12) United States Patent
Chen et al.

(10) Patent No.: US 7,126,823 B2
(45) Date of Patent: Oct. 24, 2006

(54) LOCKING DEVICE FOR HEAT DISSIPATING DEVICE

(75) Inventors: Chun-Chi Chen, Tu-Cheng (TW);
Shi-Wen Zhou, Shenzhen (CN);
Hsieh-Kun Lee, Tu-Cheng (TW)

(73) Assignee: Hon Hai Precision Industry Co., Ltd., Taipei Hsien (TW)

( * ) Notice: Subject to any disclaimer, the term of this patent is extended or adjusted under 35 U.S.C. 154(b) by 322 days.

(21) Appl. No.: 10/892,796

(22) Filed: Jul. 16, 2004

(65) Prior Publication Data

US 2005/0135064 A1    Jun. 23, 2005

(30) Foreign Application Priority Data

Dec. 19, 2003    (CN) .................. 2003 2 0119787

(51) Int. Cl.
*H05K 7/20* (2006.01)

(52) U.S. Cl. ............... 361/702; 361/704; 361/718; 361/712; 361/719; 257/718; 257/719; 257/727; 165/80.3; 24/453; 411/45; 411/41

(58) Field of Classification Search ............... 361/704, 361/703, 705–712, 714, 717–719, 720; 257/706–719, 257/722–727; 174/16.3, 252; 165/80.3, 165/185, 453, 457, 458; 248/510; 24/297, 24/508, 457–458, 453; 439/259, 267, 488, 439/642, 700, 824, 76.1; 411/508–511, 518, 411/521, 297, 913
See application file for complete search history.

(56) References Cited

U.S. PATENT DOCUMENTS 6,480,387 B1 * 11/2002 Lee et al. ............... 361/704
6,514,023 B1 * 2/2003 Moerke .................. 411/45
6,667,882 B1 * 12/2003 Pauser ................... 361/695
6,667,884 B1 * 12/2003 Lee et al. ............... 361/697
6,795,317 B1 * 9/2004 Liu ....................... 361/704
6,826,054 B1 * 11/2004 Liu ....................... 361/719
6,829,143 B1 * 12/2004 Russell et al. .......... 361/704
6,886,540 B1 * 5/2005 Suzuki et al. ........... 123/478
6,934,155 B1 * 8/2005 Aoki et al. .............. 361/704

FOREIGN PATENT DOCUMENTS

TW        452097       8/2001
TW        454899       9/2001

* cited by examiner

*Primary Examiner*—Michael Datskovskiy
(74) *Attorney, Agent, or Firm*—Tim Tingkang Xia; Morris Manning Martin LLP

(57) ABSTRACT

A locking device for mounting a heat sink to a CPU mounted on a printed circuit board, includes a back plate mounted below the circuit board and having a plurality of fasteners extending upwardly beyond the circuit board, and a plurality of retainers. Each retainer includes an operating member resting on a heat sink, a locking member extending through the operating member, and a pushing member extending through the locking member. The locking member includes a locking structure extending through the heat sink to engage with one of the fasteners. The pushing member includes a taper bottom portion. The pushing member is downward movable to cause the taper bottom portion to disengage the locking structure from the one of the fasteners.

18 Claims, 5 Drawing Sheets

LOCKING DEVICE FOR HEAT DISSIPATING DEVICE

TECHNICAL FIELD

The present invention relates to a locking device, and particularly to a locking device which can conveniently mount a heat sink to an electronic component.

BACKGROUND

As computer technology continues to advance, electronic components such as central processing units (CPUs) of computers are made to provide faster operational speed and greater functional capabilities. When a CPU operates at a high speed in a computer enclosure, its temperature increases greatly and dramatically. It is desirable to dissipate the generated heat quickly, for example, by using a heat sink attached to the CPU in the enclosure. This allows the CPU and other electronic components in the enclosure to function within their normal operating temperature ranges, thereby assuring the quality of data management, storage and transfer. Generally, a locking device is required for mounting the heat sink to the CPU.

FIG. 5 shows a conventional locking device for mounting a heat sink 200 to a CPU 600. The CPU 600 is mounted on a printed circiut board 500 which defines mounting holes 502 about the CPU 600. The heat sink 200 forms a pair of extension arms 202 each of which defines a through hole 204 corresponding to one of the mounting holes 502 of the printed circuit board 500. The locking device comprises a pair of push-in pins 300 and a pair of springs 400 installed around the pins 300 respectively. In assembly, the pins 300 are inserted and extend sequentially through the respective springs 400, through holes 204 of the heat sink 200 and mounting holes 502. The bottom ends of the pins 300 are engaged with the printed circuit board 500 below the mounting holes 502. The springs 400 are compressed between the top ends of the pins 300 and the heat sink 200 to thereby exert downward force to the heat sink 200 to cause the heat sink 200 to intimately contact with the CPU 600.

However, it is difficult to detach the push-in pins 300 from the printed circuit board 500 in disassembly. Furthermore, the springs 400 are prone to fatigue after a long time using. As a result, the heat sink 200 is not capable of intimately contacting with the CPU 600 in an acceptably long-used period.

SUMMARY OF THE INVENTION

Accordingly, an object of the present invention is to provide a locking device which can firmly mount a heat sink to an electronic component for a long term and conveniently detach the heat sink from the electronic component.

To achieve the above-mentioned object, a locking device in accordance with a preferred embodiment of the present invention comprises a back plate mounted below a circuit board and comprising a plurality of fasteners extending upwardly beyond the circuit board, and a plurality of retainers. Each retainer comprises an operating member for resting on a heat sink, a locking member extending through the operating member, and a pushing member extending through the locking member. The locking member comprises a locking structure extending through the heat sink to engage with one of the fasteners. The pushing members are downward pushable to disengage the locking structure from the one of the fasteners.

Other objects, advantages and novel features of the present invention will be drawn from the following detailed description of a preferred embodiment of the present invention with attached drawings, in which:

DETAILED DESCRIPTION OF A PREFERRED EMBODIMENT

Figure 1:
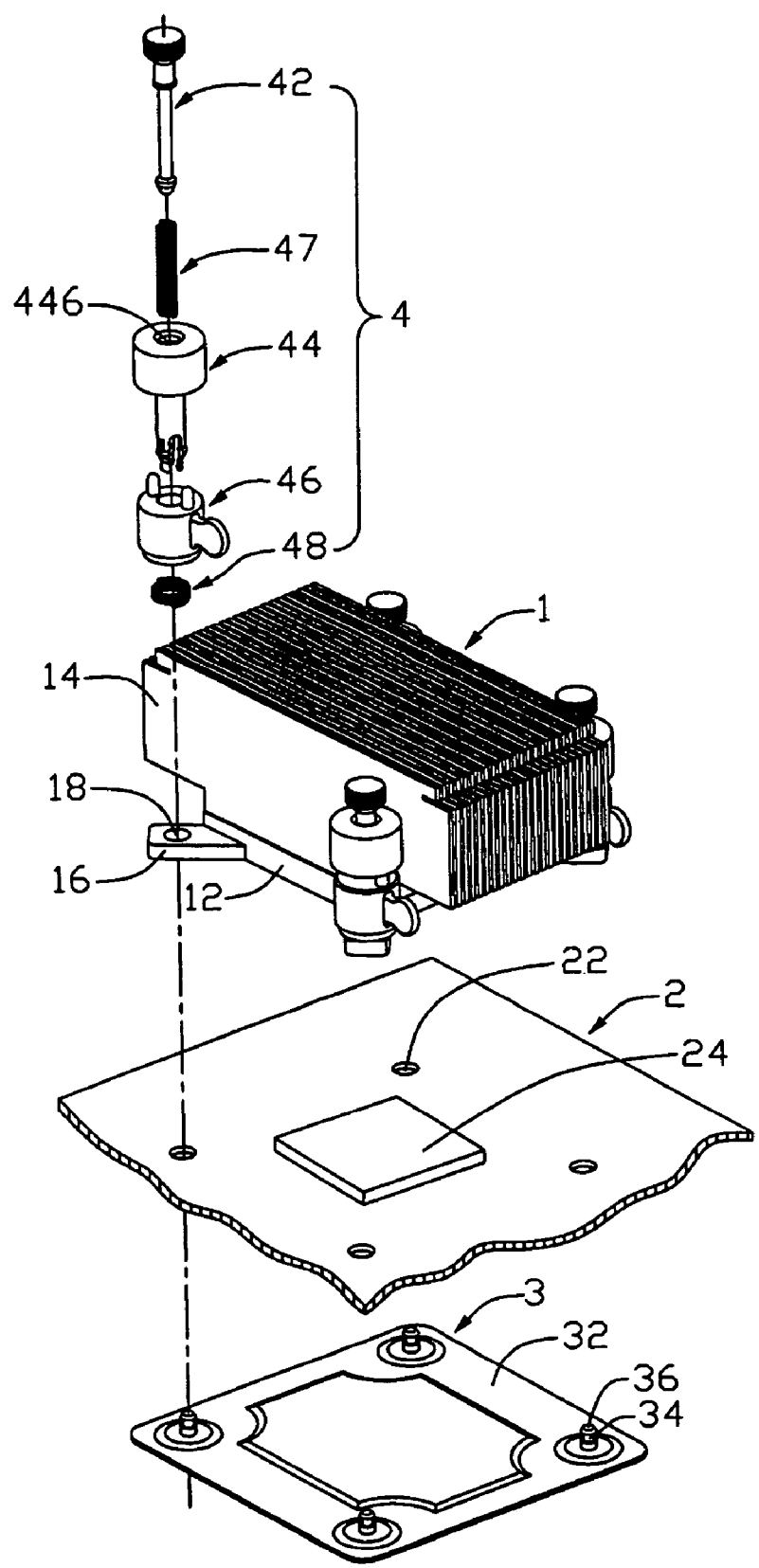
FIG. 1 is an exploded, isometric view of a locking device in accordance with a preferred embodiment of the present invention, a heat sink and a CPU mounted on a printed circuit board.

FIG. 1 shows a locking device in accordance with a preferred embodiment of the present invention for mounting a heat sink 1 to a printed circuit board 2. The printed circuit board 2 defines four through holes 22. An electronic component 24, such as a central processing unit (CPU), is installed on the printed circuit board 2, surrounded by the through holes 22. The heat sink 1 comprises a base 12 for contacting the CPU 70 and a plurality of fins 14 extending from the base 12. Four extension arms 16 extend from four corners of the base 12. Each arm 16 defines a through hole 18 corresponding to one of the through holes 22 of the printed circuit board 2.

The locking device comprises a back plate 3 and four retainers 4. The back plate 3 is for being mounted below the printed circuit board 2 and comprises a body 32 and four posts 34 extending upwardly from corners of the body 32. Each post 34 forms a barb 36 on a top end thereof to form a fastener. Each retainer 4 comprises a pushing member 42, a locking member 44, an operating member 46, a pair of first and second springs 47, 48.

Figure 2:
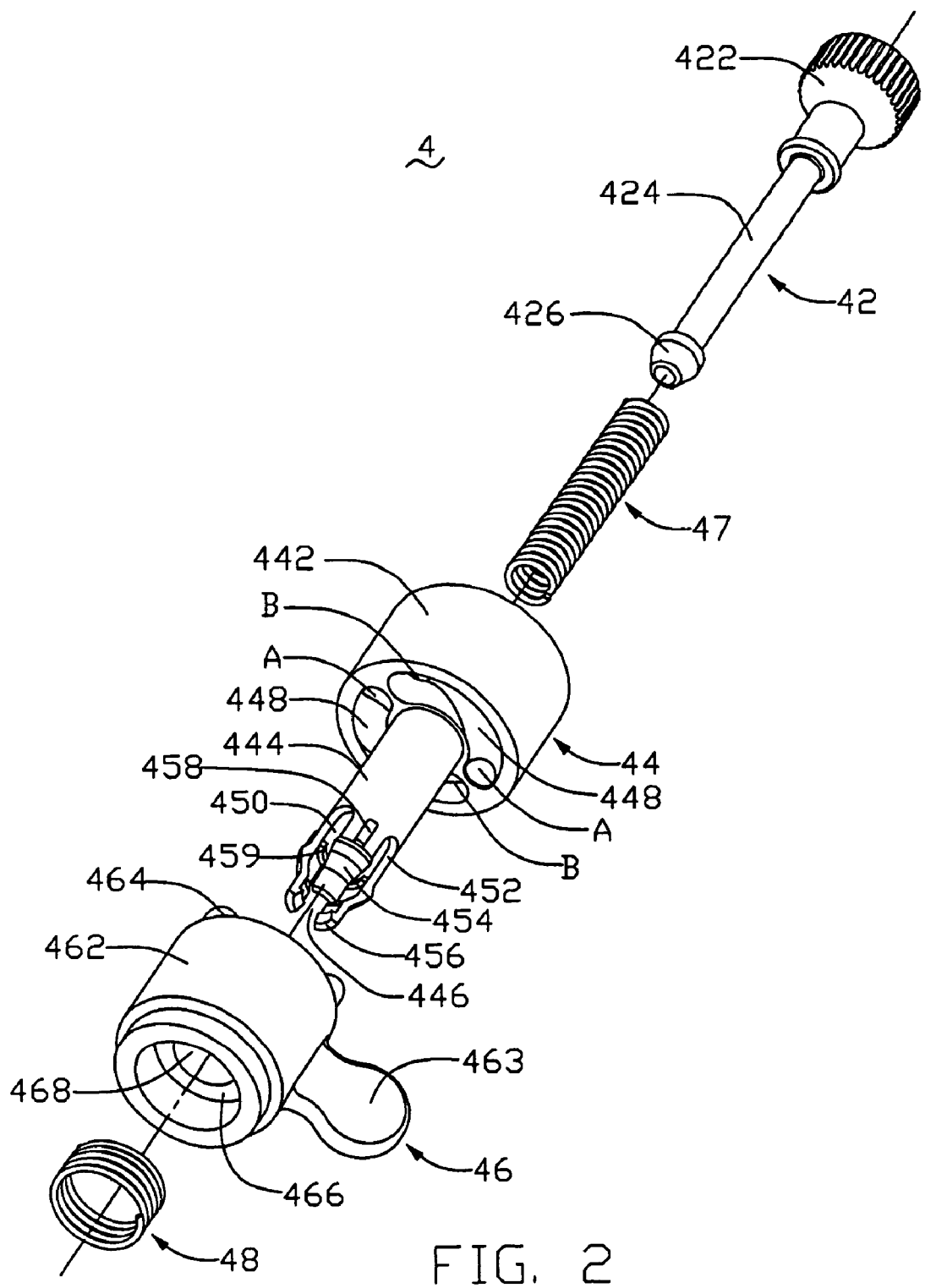
FIG. 2 is an exploded view of a retainer of the locking device of FIG. 1.

Referring also to FIG. 2, the pushing member 42 comprises a head portion 422, a middle portion 424 extending downwardly from the head portion 422, and a bottom portion 426 formed at the bottom of the middle portion 424. The bottom portion 426 has a taper configuration and the transversely sectional diameter thereof increases gradually in a bottom-to-up direction.

The locking member 44 comprises a head 442 and a cylindric body 444 formed below the head 442. A through aperture 446 is defined in the locking member 44 extending through the head 442 and the body 444. The head 442 defines a pair of spaced semi-annular transverse grooves 448 in the bottom face thereof. The grooves 448 are concentric with each other along the axis of the head 442. Each groove 448 comprises a shallow end A and a deep end B opposing to end A. The depth of each groove 448 increases gradually from the shallow end A to the deep end B. The bottom end of the body 444 defines three longitudinal slots 450 to thereby form three spaced elastic plates 452 beside the three slots 450. Each elastic plate 452 forms a slanted portion 454 at the middle thereof corresponding to the taper bottom portion 426 of the pushing member 42. Each elastic plate 452 forms a hook 456 at the inner face of the distal end thereof. A longitudinal rib 458 is formed on the outer surface of each elastic plate 452. A pair of transverse flanges 459 is formed on the inner surfaces of two of the elastic plates 452.

The operating member 46 comprises a cylinder 462 with a through aperture 468 defined therein, and a handle 463 formed on the outer circumferential surface of the cylinder 462. A pair of poles 464 extends upwardly from the top surface of the cylinder 462 and is slidable in the respective grooves 448 of the locking member 44. A cavity 466 having a larger diameter than that of the through aperture 468 is defined in the lower portion of the cylinder 462 for receiving the second spring 48 therein.

In pre-assembly, the first spring 47 is disposed around the middle portion 424 of the pushing member 42. The pushing member 42 with the preset first spring 47 is inserted into and extends through the through aperture 446 of the locking member 44 to have the first spring 47 totally received in the through aperture 446 of the locking member 44 and the bottom portion 426 of the pushing member 42 extending beyond the locking member 44. The body 444 of the locking member 44 then is inserted into and extends through the cylinder 46 and the second spring 48 sequentially. The second spring 48 is received in the cavity 466 of the operating member 46 and firmly disposed around the ribs 458 of the locking member 44. The poles 464 of the operating member 46 are received in the corresponding grooves 448 of the locking member 44 and initially located at the deep ends B. Thus, the retainer 4 is pre-assembled.

Figure 3:
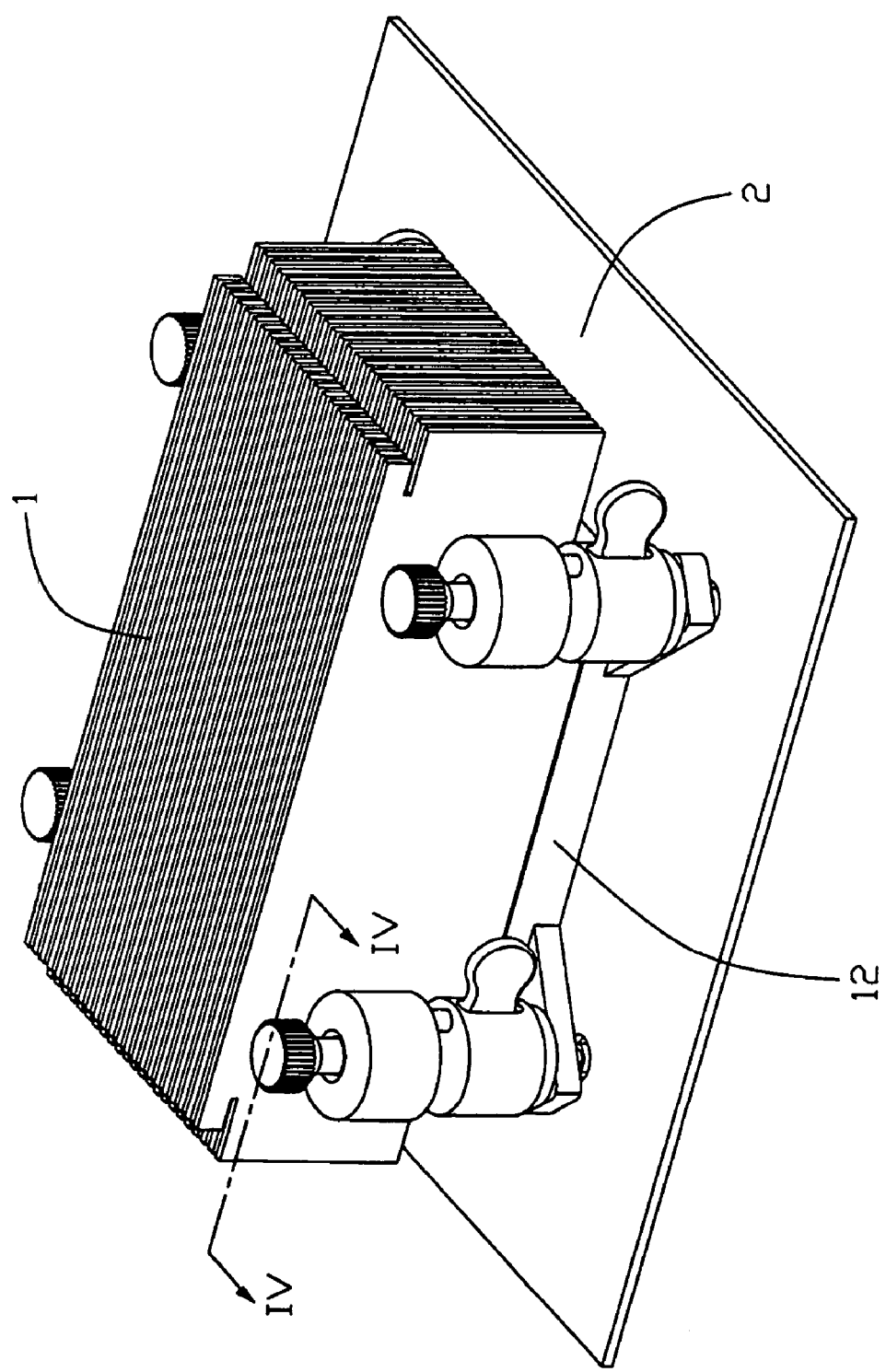
FIG. 3 is an assembled view of FIG. 1.
Figure 4:
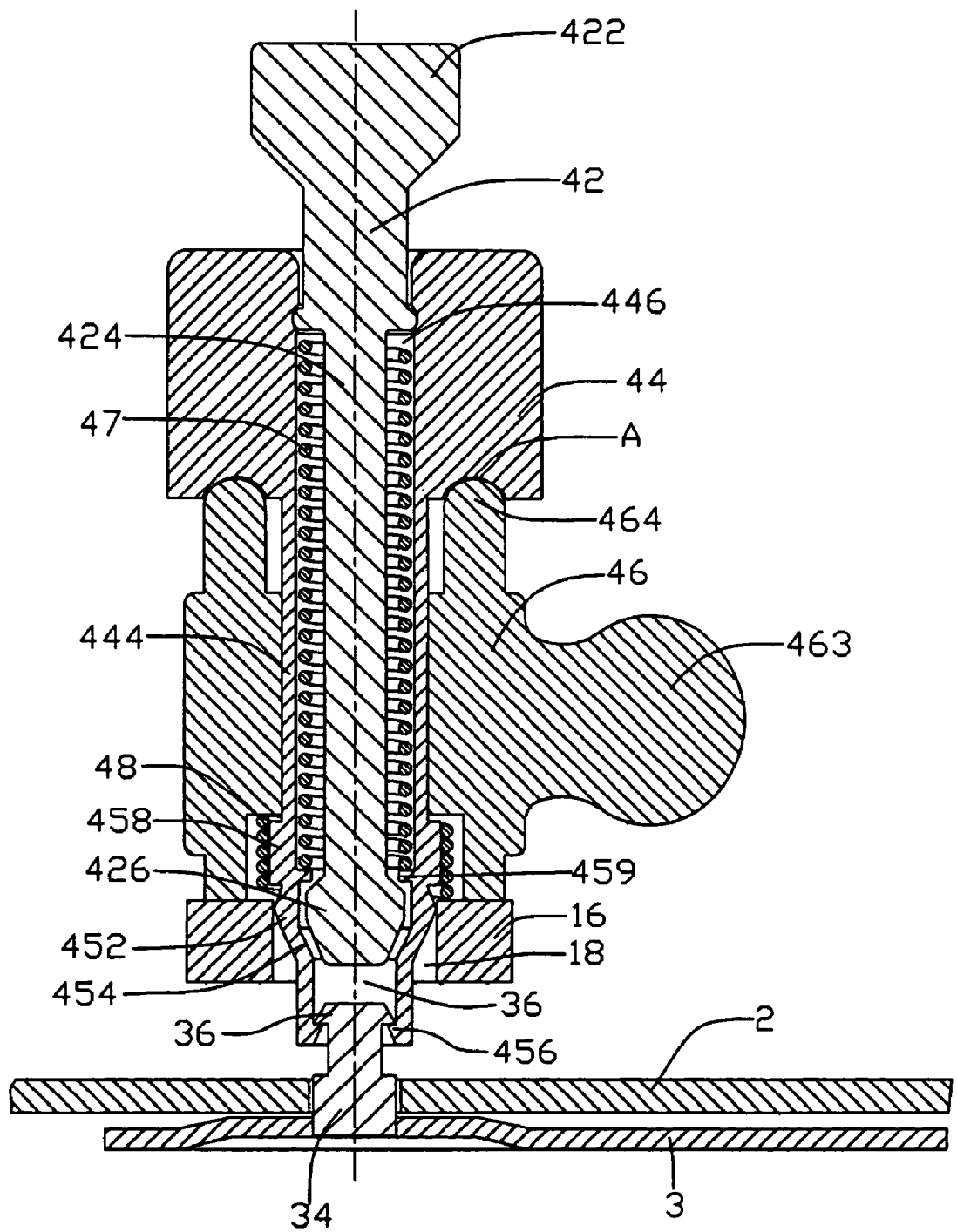
FIG. 4 is a cross-section view taken along line IV—IV of FIG. 3.
Figure 5:
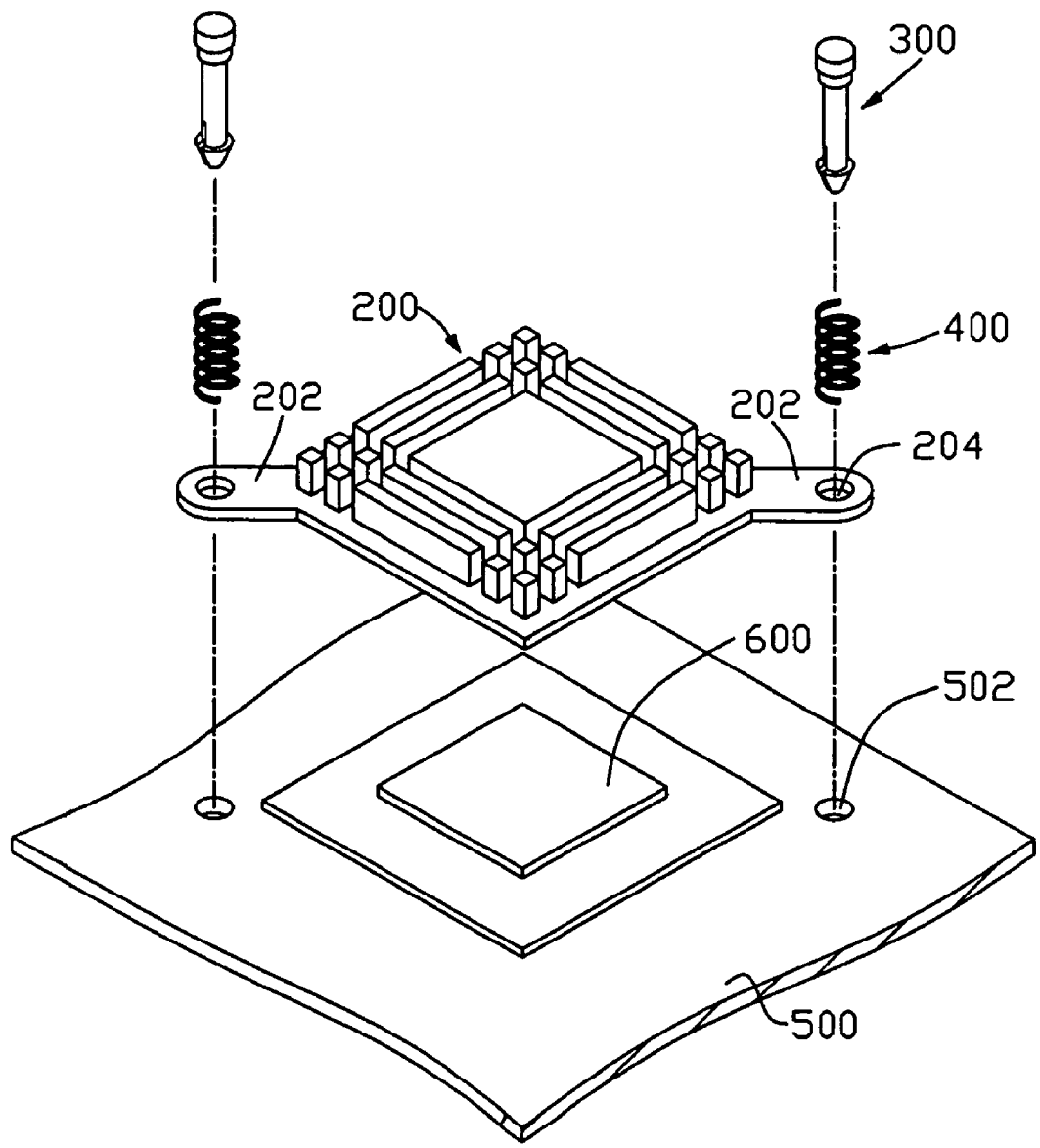
FIG. 5 shows a conventional locking device for mounting a heat sink to a CPU.

Referring to FIGS. 3–4, in assembly, the back plate 3 is mounted below the printed circuit board 2 with the posts 34 extending through the respective through holes 22 of the heat sink 1. The heat sink 1 is placed on the CPU 24 with the through holes 18 of the heat sink 1 aligned with the respective through holes 22 of the printed circuit board 2. The retainers 4 are placed on the respective arms 16 of the heat sink 1. The bodies 444 of the locking members 44 extend through the corresponding through holes 18 of the heat sink 1 to cause the hooks 456 of the locking members 40 to interlock with the barbs 36 of the back plate 3. The operating members 46 are forced to rotate so as to cause the poles 464 thereof to move from deep ends B to shallow ends A in the grooves 448 of the locking members 44. The operating members 46 are therefore pushed downwardly by the locking members 44 until the operating members 46 firmly contact the corresponding arms 16 of the heat sink 1. The second springs 48 are thus compressed. The operating members 46 exert downward forces to the heat sink 1 whereby the heat sink 1 intimately contacts the CPU 24. Thus, the locking device firmly mounts the heat sink 1 to the CPU 24.

In disassembly, the pushing members 42 are downwardly pushed. The taper bottom portions 426 of the pushing members 42 push the elastic plates 452 of the locking members 44 outwardly after they contact the slanted portions 454 of the elastic plates 452. The hooks 456 of the locking members 44 therefore move outwardly to release from the barbs 36 of the back plate 3. The second springs 48 stretch toward their original states. The operating members 46 and the locking members 44 are therefore pushed upwardly by the second springs 48 to cause the hooks 456 of the locking members 44 to move away from the barbs 36 of the back plate 3. After that, the retainers 4 are readily detached from the printed circuit board 2.

In the preferred embodiment, the grooves 448 of the locking member 44 and the poles 464 of the operating member 46 constitute an actuating structure. Alternatively, the positions of the grooves and the poles can be exchanged, i.e., the grooves 448 are formed in the operating member 46 while the poles 464 are formed on the locking member 44. As another embodiment, the actuating structure comprises two pairs of annular wedgy blocks formed on the locking member 44 and the operating member 46 respectively. When one of the wedgy blocks is rotated relative to the other one of the wedgy blocks in a circumferential direction the one of the wedgy blocks is pushed to move relative to the other one of the wedgy blocks in an axis by the other one of the wedgy blocks.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A retainer for mounting a heat sink about which fasteners are provided, comprising:
   an operating member adapted for resting on the heat sink;
   a locking member extending through the operating member and having a locking structure adapted for engaging with one of the fasteners;
   a pushing member extending through the locking member; and
   an actuating structure formed between the operating member and the locking member; wherein
   the operating member is rotatable in a circumferential direction to cause the actuating structure to drive the operating member to move toward the heat sink in an axial direction and the pushing member is downward movable to disengage the locking structure from said one of the fasteners.

2. The retainer as claimed in claim 1, wherein the actuating structure comprises at least one groove formed in one of the operating member and the locking member, and at least one pole formed on the other one of the operating member and the locking member.

3. The retainer as claimed in claim 2, wherein said groove is semi-annular shape coaxial with the axis of the operating member and the depth thereof in the axial direction increases gradually along the circumferential direction.

4. The locking device as claimed in claim 1, wherein the locking structure comprises a plurality of spaced elastic plates formed at the bottom of the locking member, and each elastic plate forms a hook at the bottom thereof.

5. The locking device as claimed in claim 4, wherein each elastic plate further forms a slanted portion above the hook, and the pushing member comprises a taper bottom portion of which the transversly sectional diameter increases gradually in a bottom-to-up direction.

6. The locking device as claimed in claim 5, wherein a spring is disposed on the pushing member for driving the pushing member back to its original position after the pushing member disengages the locking structure from said one of the fasteners.

7. The locking device as claimed in claim 1, wherein a spring is disposed on the locking member for upwardly pushing the operating member when the locking structure is disengaged from said one of the fasteners.

8. A combination comprising:
   a circuit board with an electronic component mounted thereon;
   a heat sink placed on the electronic component; and
   a locking device for mounting the heat sink on the electronic component, the locking device comprising:
   a back plate mounted below the circuit board and comprising a plurality of fasteners extending upwardly beyond the circuit board; and a plurality of retainers each comprising an operating member resting on the heat sink, a locking member extending through the operating member and having a locking means extending through the heat sink to engage with one of the fasteners, and a pushing member extending through the locking member and comprising a pushing means;

wherein the pushing member is downward movable to cause the pushing means to disengage the locking means from said one of the fasteners.

9. The combination as claimed in claim 8, wherein the locking means comprises a plurality of spaced elastic plates each having a hook formed on the end thereof.

10. The combination as claimed in claim 9, wherein each elastic plate further forms a slanted portion above the hook, and the pushing means comprises a taper portion of which the transversly sectional diameter increases gradually in a bottom-to-up direction.

11. The combination as claimed in claim 8, further comprising an actuating structure formed between the operating member and the locking member, wherein the operating member is rotatable in a circumferential direction to cause the actuating structure to drive the operating member to move in an axial direction.

12. The combination as claimed in claim 11, wherein the actuating structure comprises at least one groove formed in one of the operating member and the locking member, and at least one pole formed on the other one of the operating member and the locking member.

13. The combination as claimed in claim 12, wherein said groove is semi-annular shape coaxial with the axis of the operating member and the depth thereof in the axial direction increases gradually along the circumferential direction.

14. A combination comprising:

a circuit board with an electronic component mounted thereon;

a heat sink placed on the electronic component; and a locking device for mounting the heat sink on the electronic component, the locking device comprising:

a back plate mounted below the circuit board and comprising a plurality of fasteners extending upwardly beyond the circuit board; and a plurality of retainers each comprising an operating member located above the heat sink, a locking member extending through the operating member and having a locking means extending through the heat sink to engage with one of the fasteners, a pushing member extending through the locking member, and an actuating structure formed between the operating member and the locking member;

wherein the operating member is rotatable in a circumferential direction to cause the actuating structure to drive the operating member to move toward the heat sink in an axial direction.

15. The combination as claimed in claim 14, wherein the actuating structure comprises at least one groove formed in one of the operating member and the locking member, and at least one pole formed on the other one of the operating member and the locking member.

16. The combination as claimed in claim 15, said groove is semi-annular shape coaxial with the axis of the operating member and the depth thereof in the axial direction increases gradually along the circumferential direction.

17. The combination as claimed in claim 14, wherein the pushing member comprises a pushing means, and the pushing member is downward movable to cause the pushing means to disengage the locking means from the fastening means.

18. The combination as claimed in claim 17, wherein a spring is compressed between the operating member and the heat sink for upwardly pushing the operating member when the locking means is disengaged from said one of the fasteners.

* * * * *